US009030647B2

(12) United States Patent
Kwan et al.

(10) Patent No.: US 9,030,647 B2
(45) Date of Patent: May 12, 2015

(54) OPTICAL IMAGING ARRANGEMENT WITH VIBRATION DECOUPLED SUPPORT UNITS (71) Applicant: Carl Zeiss SMT GmbH, Oberkochen (DE)

(72) Inventors: Yim-Bun Patrick Kwan, Aalen (DE); Dick Antonius Hendrikus Laro, Breda (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/138,987

(22) Filed: Dec. 23, 2013

(65) Prior Publication Data
US 2014/0185029 A1 Jul. 3, 2014

Related U.S. Application Data (63) Continuation-in-part of application No. PCT/EP2012/053743, filed on Mar. 5, 2012, which is a continuation-in-part of application No. PCT/EP2011/061157, filed on Jul. 1, 2011.

(51) Int. Cl.
*G03B 27/54* (2006.01)
*G03B 27/42* (2006.01)
(Continued)

(52) U.S. Cl.
CPC .......... *G02B 27/646* (2013.01); *G03F 7/70825* (2013.01); *G03F 7/70833* (2013.01); *G03F 7/709* (2013.01); *G03F 7/7015* (2013.01)

(58) Field of Classification Search
CPC .. G03F 7/70825; G03F 7/709; G03F 7/70715
USPC ................................................ 355/53, 72–76
See application file for complete search history.

(56) References Cited

U.S. PATENT DOCUMENTS

| 5,508,518 A | 4/1996 | Kendall |
| 5,953,105 A | 9/1999 | Van Engelen et al. |

(Continued)

FOREIGN PATENT DOCUMENTS

| EP | 1 321 822 | 6/2003 |
| EP | 1 477 850 | 11/2004 |

(Continued)

OTHER PUBLICATIONS

International Search Report for corresponding PCT Appl No. PCT/EP2012/053743, dated Jun. 28, 2012.

(Continued)

*Primary Examiner* — Hung Henry Nguyen
(74) *Attorney, Agent, or Firm* — Fish & Richardson P.C.

(57) ABSTRACT

An optical imaging arrangement includes an optical projection system and a support structure system. The optical projection system includes a group of optical elements configured to transfer, in an exposure process using exposure light along an exposure light path, an image of a pattern of a mask supported by a mask support structure onto a substrate supported by a substrate support structure. The mask support structure and the substrate support structure form a primary source of vibration. The support structure system includes a base support structure, an optical element support structure and at least one secondary vibration source support structure of a secondary vibration source other than the primary source of vibration. The optical element support structure supports the optical elements.

20 Claims, 4 Drawing Sheets (51) Int. Cl.
  *G02B 27/64* (2006.01)
  *G03F 7/20* (2006.01)

(56) References Cited

U.S. PATENT DOCUMENTS

| | | | |
|---|---|---|---|
| 6,472,840 | B1 | 10/2002 | Takahashi |
| 7,283,210 | B2 * | 10/2007 | Hazelton .................. 355/72 |
| 7,817,248 | B2 * | 10/2010 | Kwan ...................... 355/67 |
| 8,044,373 | B2 * | 10/2011 | Butler ................. 250/492.2 |
| 2004/0227107 | A1 | 11/2004 | Cox et al. |
| 2004/0257549 | A1 | 12/2004 | Leenders et al. |
| 2006/0215133 | A1 | 9/2006 | Hazelton |
| 2007/0076184 | A1 | 4/2007 | Kwan et al. |
| 2008/0212083 | A1 | 9/2008 | Kwan |
| 2009/0033895 | A1 | 2/2009 | Binnard |

FOREIGN PATENT DOCUMENTS

| | | |
|---|---|---|
| EP | 1 646 074 | 4/2006 |
| EP | 2 128 700 | 12/2009 |

OTHER PUBLICATIONS

International Preliminary Report on Patentability for corresponding PCT Appl No. PCT/EP2012/053743, dated Jan. 7, 2014.
International Search Report and Written Opinion for corresponding PCT Appl No. PCT/EP2011/061157, dated Oct. 9, 2012.
International Preliminary Report on Patentability for corresponding PCT Appl No. PCT/EP2011/061157, dated Jan. 7, 2014.

* cited by examiner

OPTICAL IMAGING ARRANGEMENT WITH VIBRATION DECOUPLED SUPPORT UNITS

CROSS-REFERENCE TO RELATED APPLICATIONS

The present application is a continuation-in-part of, and claims priority under 35 USC 120 to, international application PCT/EP2012/053743, filed Mar. 5, 2012. The present application is also a continuation-in-part of, and claims priority under 35 USC to, international application PCT/EP2011/061157, filed Jul. 1, 2011. The entire disclosures of international application PCT/EP2012/053743 and PCT/EP2011/061157 are incorporated by reference herein.

BACKGROUND OF THE INVENTION

The invention relates to optical imaging arrangements used in exposure processes, in particular to optical imaging arrangements of microlithography systems. It further relates to a method of supporting components of an optical projection unit. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element units comprising optical elements, such as lenses and mirrors etc., arranged in the light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically also referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture (NA) and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths ranging from 5 nm to 20 nm, typically about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems comprising reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the crucial accuracy requirements is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict requirements with respect to the relative position between the components participating in the exposure process. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical imaging arrangement components, i.e. the mask, the optical elements and the wafer, for example, cooperating in the exposure process must be supported in a defined manner in order to maintain a predetermined spatial relationship between the optical imaging arrangement components as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), the optical imaging arrangement as well as the under the influence of thermally induced position alterations, it is necessary to at least intermittently capture the spatial relationship between certain components of the optical imaging arrangement and to adjust the position of at least one of the components of the optical imaging arrangement as a function of the result of this capturing process.

In conventional systems, this process of capturing the spatial relationship between components cooperating in the exposure process is done via a metrology system using a central support structure for the optical projection system and the substrate system as a common reference in order to be able to readily synchronize motion of the actively adjusted parts of the imaging arrangement.

On the other hand, an increase in the numerical aperture, typically, leads to an increased size of the optical elements used, also referred to as the optical footprint of the optical elements. The increased optical footprint of the optical elements used has a negative impact on their dynamic properties and the control system used to achieve the above adjustments. Furthermore, the increased optical footprint typically leads to larger light ray incidence angles. However, at such increased larger light ray incidence angles transmissivity of the multilayer coatings typically used for generating the reflective surface of the optical elements is drastically reduced, obviously leading to an undesired loss in light power and an increased heating of the optical elements due to absorption. As a consequence, even larger optical elements have to be used in order to enable such imaging at a commercially acceptable scale. These circumstances lead to optical imaging arrangements with comparatively large optical elements having an optical footprint of up to 1 m×1 m and which are arranged very close to each other with mutual distances ranging down to less than 60 mm.

Several problems result from this situation. First, irrespective of the so-called aspect ratio (i.e. the thickness to diameter ratio) of the optical element, a large optical element generally exhibits low resonant frequencies. While, for example, a mirror with an optical footprint of 150 mm (in diameter) and a thickness of 25 mm typically has resonant frequencies above 4000 Hz, a mirror with an optical footprint of 700 mm, typically, hardly reach resonant frequencies above 1500 Hz even at a thickness of 200 mm. Furthermore, increased size and weight of the optical elements also means increased static deformation due to variations of the gravitational constant at different locations all over the world, which impairs imaging performance when uncorrected.

With conventional support systems striving to support the optical elements at a maximum rigidity (i.e. at maximized resonant frequencies of the support system) low resonant frequencies of the optical element itself lead to a reduction of the adjustment control bandwidth and, hence, reduced position accuracy.

Furthermore, large optical elements resulting in a large object to image shift ultimately lead to a large and less rigid support structure for the optical system. Such a less rigid support structure not only contributes to further restrictions of adjustment control performance, but also residual errors due to quasi-static deformations of the structure caused by residual low frequency vibration disturbances. Hence, the negative effects of vibration disturbances become even more prominent.

Finally, the increased thermal load on the optical elements used (due to light energy absorption) and the increased throughput desired for such systems requires increased cooling efforts, in particular, higher flow rates of the cooling fluids used. This increased cooling flow rate is prone to lead to an increase in the vibration disturbances introduced into the system, in turn leading to reduced line-of-sight accuracy.

SUMMARY OF THE INVENTION

It is thus an object of the invention to, at least to some extent, overcome the above disadvantages and to provide good and long term reliable imaging properties of an optical imaging arrangement used in an exposure process.

It is a further object of the invention to reduce the effort necessary for an optical imaging arrangement while at least maintaining the imaging accuracy of the optical imaging arrangement used in an exposure process.

These objects are achieved according to the invention which, according to one aspect, is based on the technical teaching that an overall reduction of the effort necessary for an optical imaging arrangement while at least maintaining the imaging accuracy of the optical imaging arrangement may be achieved if a conventional support and metrology strategy striving to achieve a central support structure forming a common metrology reference (to achieve stable and accurate global positioning of the projection system and the substrate system) is dispensed with in favor of a modified concept according to which the support of the optical elements of the optical projection system is mechanically decoupled from the support of sources of internal secondary vibration disturbances (i.e. components internal to the optical imaging arrangement causing vibration disturbances) other than a primary vibration disturbance stemming from the mask support and the substrate support.

It should be noted that, in the sense of the present invention, a component internal to the optical imaging arrangement shall define a component that participates in the optical imaging process performed by the optical imaging arrangement. Such participation may be either direct (such as it is the case e.g. with active components of the optical system or the substrate system) or indirect (such as it is the case e.g. with fluid circulating systems, such as cooling systems or immersion systems, of the optical imaging arrangement). In contrast to that, in the sense of the present invention, a component external to the optical imaging arrangement shall define a component that does not participate in the optical imaging process performed by the optical imaging arrangement. Such external components include, in particular, components of adjacent optical imaging arrangements.

This may be done by supporting both the support structure for the optical projection system (i.e. the support structure for the optical elements) as well as the support structure for such secondary sources of vibration disturbance on a base structure such that there is no immediate structural connection between the support structure for the optical projection system and the support structure for secondary vibration disturbances sources. Hence, structure borne vibration of such secondary vibration disturbances sources, in a beneficial way, is detoured via the base structure, thereby beneficially increasing the length of the structural path a secondary vibration disturbance would have to travel to reach the optical projection system and, consequently, beneficially increasing attenuation of the secondary vibration disturbance.

Preferably, at least the support structure for the optical elements is supported on the base structure via a vibration isolation device to reduce the vibration disturbance energy introduced into this support structure. Even more preferably, the support structure for secondary vibration disturbance sources is also supported on the base structure via a comparable vibration isolation device to reduce the amount of vibration disturbance energy introduced into the base structure.

It will be appreciated that, in the sense of the present invention, an optical element unit may merely consist of an optical element, such as a mirror. However, such an optical element unit may also comprise further components such as a holder holding such an optical element.

Thus, according to a first aspect of the invention there is provided an optical imaging arrangement comprising an optical projection system and a support structure system. The optical projection system comprises a group of optical elements configured to transfer, in an exposure process using exposure light along an exposure light path, an image of a pattern of a mask supported by a mask support structure onto a substrate supported by a substrate support structure. The mask support structure and the substrate support structure form a primary source of vibration. The support structure system comprises a base support structure, an optical element support structure and at least one secondary vibration source support structure of a secondary vibration source other than the primary source of vibration. The optical element support structure supports the optical elements. The at least one secondary vibration source support structure supports a secondary vibration source, the secondary vibration source being a source of a secondary vibration disturbance comprising structure borne vibration energy and the secondary vibration source being located internal to the optical imaging arrangement. The base support structure supports the optical element support structure and the secondary vibration source support structure in such a manner that a structural path of the structure borne vibration energy from the secondary vibration source to the optical element support structure only exists through the base support unit.

According to a second aspect of the invention there is provided a method of supporting an optical projection system of an optical imaging arrangement, the optical projection system having a group of optical elements configured to transfer, in an exposure process using exposure light along an exposure light path, an image of a pattern of a mask supported by a mask support structure onto a substrate supported by a substrate support structure, the mask support structure and the substrate support structure forming a primary source of vibration. The method comprises supporting the optical elements on a base support structure via an optical element support structure, and supporting a secondary vibration source on the base support structure via a secondary vibration source support structure, the secondary vibration source being a source of a secondary vibration disturbance comprising structure borne vibration energy and the secondary vibration source being located internal to the optical imaging arrangement. The optical element support structure and the secondary vibration source support structure are supported in such a manner that a structural path of the structure borne vibration energy from the secondary vibration source to the optical element support structure only exists through the base support unit.

According to a third aspect of the invention there is provided an optical imaging arrangement comprising an optical projection system and a support structure system. The optical projection system comprises a group of optical elements configured to transfer, in an exposure process using exposure light along an exposure light path, an image of a pattern of a mask supported by a mask support structure onto a substrate supported by a substrate support structure. The mask support structure and the substrate support structure form a primary source of vibration. The support structure system comprises a base support structure, an optical element support structure and at least one secondary vibration source support structure. The optical element support structure supports the optical elements, while the at least one secondary vibration source support structure supports a secondary vibration source, the secondary vibration source being a source of a secondary vibration disturbance comprising structure borne vibration energy and the secondary vibration source being located internal to the optical imaging arrangement. The base support structure supports the optical element support structure and the secondary vibration source support structure in such a manner that the secondary vibration source support structure is mechanically decoupled from the optical element support structure via at least one vibration isolation device.

According to a fourth aspect of the invention there is provided a method of supporting an optical projection system of an optical imaging arrangement, the optical projection system having a group of optical elements configured to transfer, in an exposure process using exposure light along an exposure light path, an image of a pattern of a mask supported by a mask support structure onto a substrate supported by a substrate support structure, the mask support structure and the substrate support structure forming a primary source of vibration. The method comprises supporting the optical elements on a base support structure via an optical element support structure, and supporting a secondary vibration source on the base support structure via a secondary vibration source support structure, the secondary vibration source being a source of a secondary vibration disturbance comprising structure borne vibration energy and the secondary vibration source being located internal to the optical imaging arrangement. The optical element support structure and the secondary vibration source support structure are supported by the base support structure in such a manner that the secondary vibration source support structure is mechanically decoupled from the optical element support structure via at least one vibration isolation device.

According to a fifth aspect of the invention there is provided an optical imaging arrangement comprising an optical projection system and a support structure system. The optical projection system comprises a group of optical elements configured to transfer, in an exposure process using exposure light along an exposure light path, an image of a pattern of a mask supported by a mask support structure onto a substrate supported by a substrate support structure. The support structure system comprises a base support structure and an optical element support structure and a projection system metrology support structure. The optical element support structure supports the optical elements, the optical element support structure being supported on the base support structure via a first vibration isolation device. The projection system metrology support structure supports at least one metrology device associated to the group of optical elements and configured to capture a variable representative of a state of at least one optical element of the group of optical elements. The projection system metrology support structure is supported on the optical element support structure via a second vibration isolation device.

According to a sixth aspect of the invention there is provided a method of supporting an optical projection system of an optical imaging arrangement, the optical projection system having a group of optical elements configured to transfer, in an exposure process using exposure light along an exposure light path, an image of a pattern of a mask supported by a mask support structure onto a substrate supported by a substrate support structure. The method comprises supporting the optical elements on a base support structure via an optical element support structure, supporting at least one metrology device associated to the group of optical elements on the optical element support structure using a projection system metrology support structure, and supporting the projection system metrology support structure on the optical element support structure a via a second vibration isolation device. The at least one metrology device is configured to capture a variable representative of a state of at least one optical element of the group of optical elements.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

In the following, a preferred first embodiment of an optical imaging arrangement 101 according to the invention with which preferred embodiments of methods according to the invention may be executed will be described with reference to FIGS. 1 to 3. To facilitate understanding of the following explanations a xyz coordinate system is introduced in the Figures, wherein the z-direction designates the vertical direction (i.e. the direction of gravity).

Figure 1:
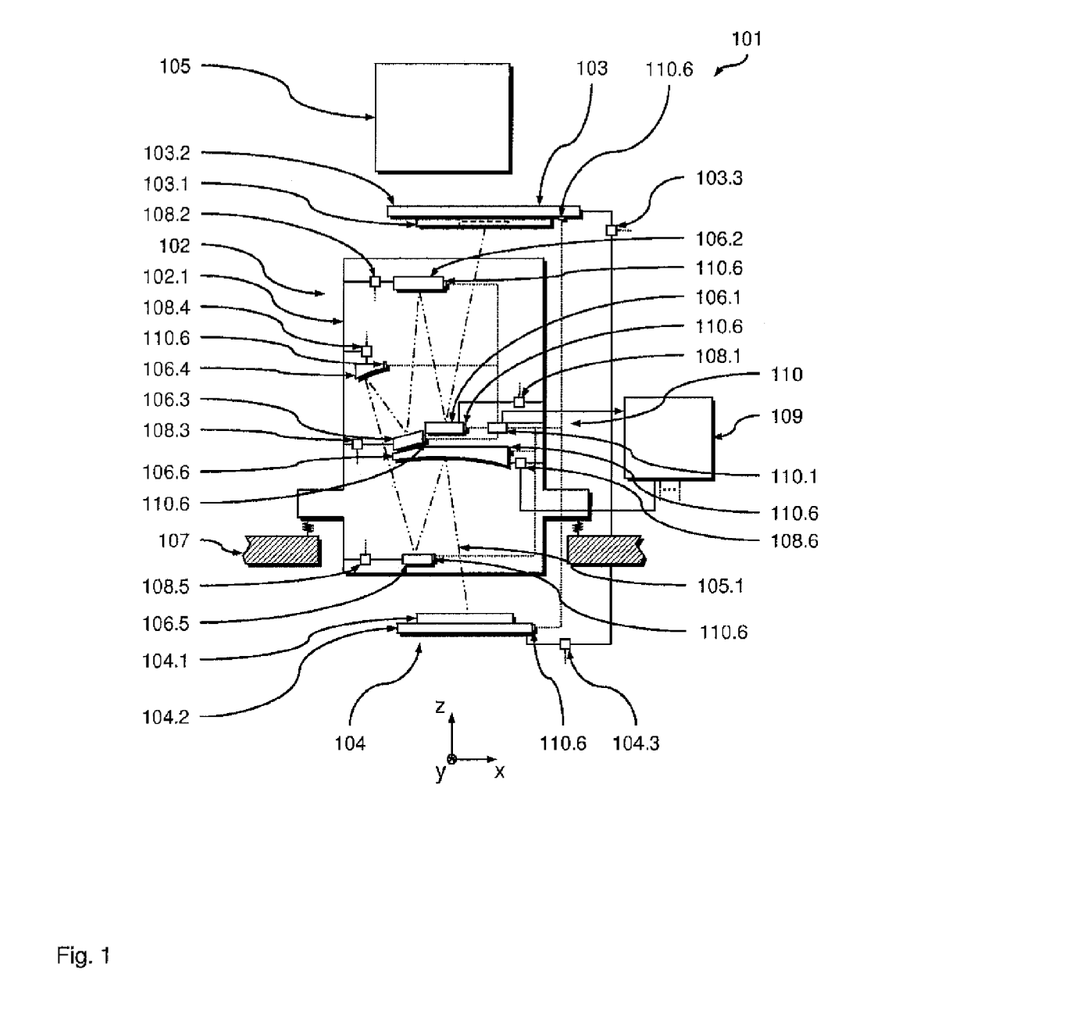
FIG. 1 is a schematic representation of a preferred embodiment of an optical imaging arrangement according to the invention with which preferred embodiments of methods according to the invention may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 comprises an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 comprises an illumination system 105 illuminating the reflective mask 103.1 via an appropriate light guide system (not shown). The optical projection unit 102 receives the light (represented by its chief ray 105.1) reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even tight enclosure of the optical element unit group 106. Rather it may also be partially formed as an open structure as it is the case with the present example.

The projection optics box structure 102.1 is supported in a vibration isolated manner on a base structure 107 which also supports the mask table 103.2 via a mask table support device 103.3 and the substrate table 104.2 via a substrate table support device 104.3. Since the mask table 103.2, the mask table support device 103.3, the substrate table 104.2 and the substrate table support device 104.3 form or comprise sources of primary vibration disturbance, the mask table support device 103.3 and the substrate table support device 104.3 each forms a primary vibration source support structure together forming a primary source of vibration in the sense of the present invention.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range as will be explained in greater detail below.

The optical element unit group 106 comprises a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 consists of an optical element in the form of a mirror. The sixth optical element 106.6 forms a first optical element subgroup 106.8, while first to fifth optical element 106.1 to 106.5 form a second optical element subgroup 106.7.

It will be appreciated however that, with other embodiments of the invention, the respective optical element unit may also comprise further components (beyond the optical element itself) such as, for example, aperture stops, holders or retainers holding the optical element and eventually forming an interface for the support unit connecting the optical element unit to the support structure.

It will be further appreciated that, with other embodiments of the invention, another number of optical element units may be used. Preferably, four to eight optical element units are provided.

Each one of the mirrors 106.1 to 106.6 is supported on the support structure formed by the projection optics box structure 102.1 by an associated support device 108.1 to 108.6. Each one of the support devices 108.1 to 108.6 is formed as an active device such that each of the mirrors 106.1 to 106.6 is actively supported at a defined control bandwidth.

In the present example, the optical element unit 106.6 is a large and heavy component forming a first optical element unit of the optical element unit group 106 while the other optical element units 106.1 to 106.5 form a plurality of second optical element units of the optical element unit group 106. The first optical element unit 106.6 is actively supported at a low first control bandwidth, while the second optical element units 106.1 to 106.5 are actively supported at a second control bandwidth to substantially maintain a given spatial relationship of each of the second optical element units 106.1 to 106.5 with respect to the first optical element unit 106.6.

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element unit 106.6. It will be appreciated however that, with other embodiments of the invention, another support concept may be chosen for the mask table and/or the substrate table.

As will be explained in further detail below, control of the active support devices 108.1 to 108.6, 103.3 and 104.3 is performed by a control unit 109 as a function on the signals of a metrology arrangement 110. Adjustment control of the components participating in the imaging process is performed the following way.

To achieve the active low bandwidth support the first optical element unit 106.6, the first support device 108.6 of the first optical element unit 106.6 is configured and controlled to provide adjustment of the first optical element unit 106.6 with respect to a component of the metrology arrangement 110 at a first adjustment control bandwidth ranging from 5 Hz to 100 Hz, preferably from 40 Hz to 100 Hz.

Furthermore, to achieve the active support the second optical element units 106.1 to 106.5, the mask table 103.2 and the substrate table 104.2, respectively, each of the second support devices 108.1 to 108.5 of the second optical element units 106.1 to 106.5 as well as the mask table support device 103.3 and the substrate table support device 104.3, respectively, is configured and controlled to provide adjustment of the respective associated optical element unit 106.1 to 106.5, the mask table 103.2 and the substrate table 104.2, respectively, at a second, third and fourth adjustment control bandwidth, respectively, ranging from 5 Hz to 400 Hz, preferably from 200 Hz to 300 Hz. It will be appreciated that, with certain embodiments of the invention, the second control bandwidth may vary among the second support devices 108.1 to 108.5.

The present embodiment, compared to conventional designs, follows a modified support strategy according to which the large and heavy first optical element unit 106.6 posing the most severe problems in reaching the high control bandwidth typically required in EUV microlithography is actively supported in a controlled manner at a low bandwidth (at which control may be readily achieved for this optical element unit 106.6) while the other components participating in the exposure process, i.e. the second optical element units 106.1 to 106.5, the mask table 103.2 and the substrate table 104.2, are controlled to maintain a sufficiently stable and accurate spatial relation with respect to the first optical element unit 106.6 and, hence, with respect to each other.

Hence, despite the fact that, in the present example, all components participating in the imaging process (i.e. the mirrors 106.1 to 106.6, the mask 103.1 and the substrate 104.1) are actively controlled, the greatly relaxed requirements for the adjustment control bandwidth of the first optical element unit 106.6 largely outweigh the increased expense for the active support of the individual components. In particular, adjustment control of a large optical footprint component such as the sixth mirror 106.6 (which may have an optical footprint of up to 1.5 m×1.5 m and a mass of up to 350 kg) is greatly facilitated compared to conventional systems where, typically, an adjustment control bandwidth of 200 Hz to 300 Hz is used and considered necessary (a control bandwidth that can hardly be reached for such large optical footprint components due to their low resonant frequency).

According to this support strategy one component of the optical system (typically a large and/or heavy one of these components) is used as an inertial reference to which one or more of the other components (up to all of the other components) may be referred to for measuring and, ultimately, adjustment purposes. In the present example, the large optical footprint sixth mirror 106.6 is used as the inertial reference to which all further components 106.1 to 106.5, 103.1 and 104.1 participating in the imaging process are referred to as will be explained in further detail below. It will be appreciated however that, with other embodiments of the invention, depending on the optical design, any suitable component other than the optical element unit hit last by the exposure light may be used as this inertial reference.

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the components participating in the exposure process (i.e. between the optical elements of the optical element unit group 106, i.e. the mirrors 106.1 to 106.6, with respect to each other as well as with respect to the mask 103.1 and with respect to the substrate 104.1 has to be maintained within predetermined limits to obtain a high quality imaging result.

During operation of the optical exposure apparatus 101, the relative position of the mirrors 106.1 to 106.6 with respect to each other as well as with respect to the mask 103.1 and the substrate 104.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the base support structure 107 (which itself is supported on a ground structure 111). They may also thermally induced disturbances, e.g. position alterations due to thermal expansion of the parts of the system.

In order to keep the above predetermined limits of the spatial relation of the mirrors 106.1 to 106.6 with respect to each other as well as with respect to the mask 103.1 and the substrate 104.1, each one of the mirrors 106.1 to 106.6 is actively positioned in space via their support devices 108.1 to 108.6, respectively. Similarly, the mask table 103.2 and the substrate table 104.2 are actively positioned in space via the respective support devices 103.3 and 104.3, respectively.

In the following, the control concept for the spatial adjustment of the components 106.1 to 106.6, 103.1 and 104.1 participating in the imaging process will be described with reference to FIGS. 1 and 2. As mentioned above, control of the adjustment of the components 106.1 to 106.6, 103.1 and 104.1 in all six degrees of freedom is done using the control unit 109 connected and providing corresponding control signals to each one of the support devices 108.1 to 108.6, 103.3 and 104.3 (as it is indicated in FIG. 1 by the solid and dotted lines at the control unit 109 and the respective support device) at the specific adjustment control bandwidth as outlined above.

Figure 2:
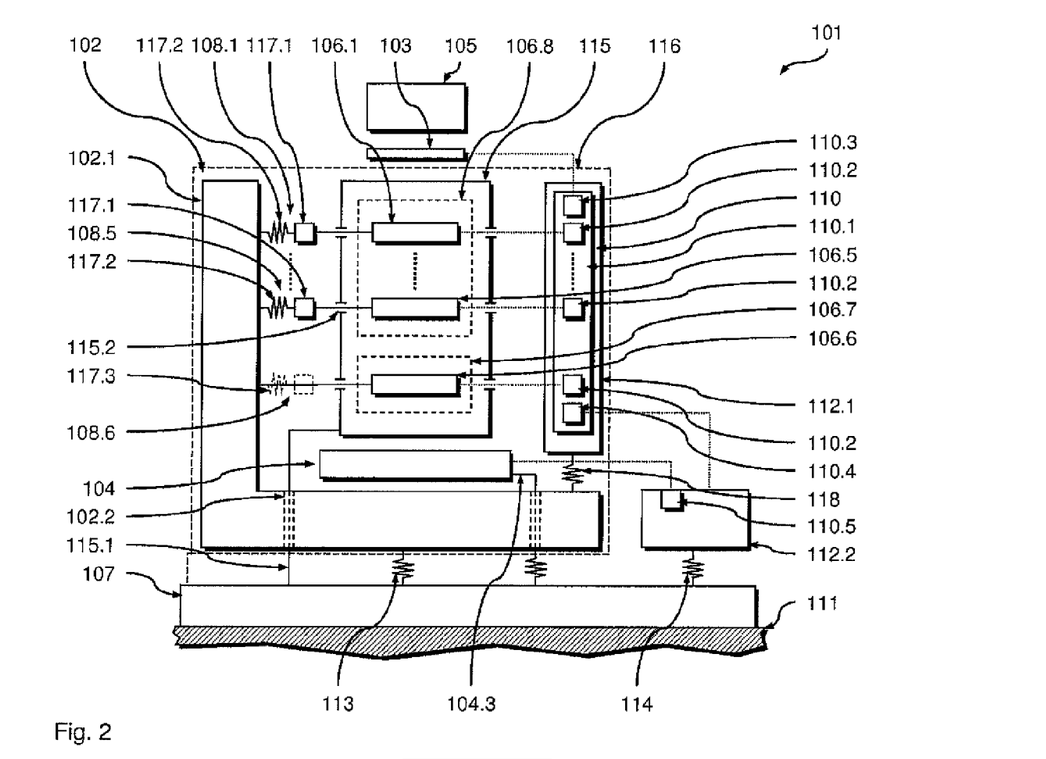
FIG. 2 is a further schematic representation of the optical imaging arrangement of FIG. 1.
Figure 3:
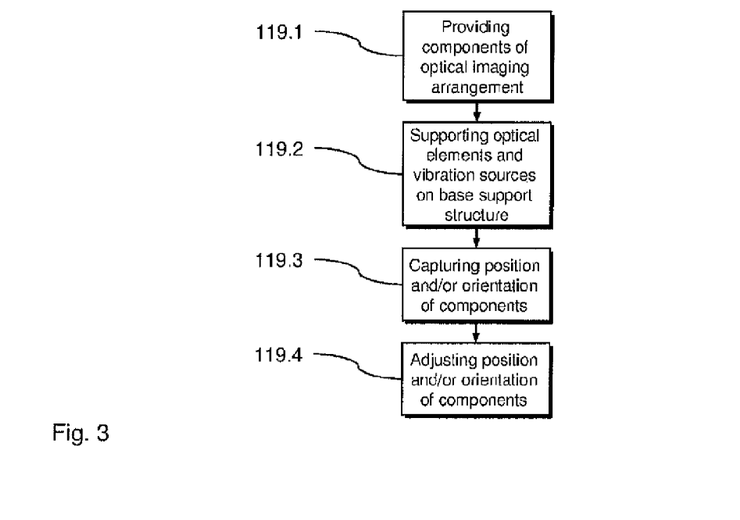
FIG. 3 is a block diagram of a preferred embodiment of a method of supporting an optical projection system which may be executed with the optical imaging arrangement of FIG. 1.

The control unit 109 generates its control signals as a function of the metrology signals of the metrology arrangement 110 which captures the position and orientation of each one of the components 106.1 to 106.6, 103.1 and 104.1 in all six degrees of freedom (as it is indicated by the dotted lines in FIGS. 1 and 2). As mentioned above, the metrology arrangement 110 uses the large optical footprint sixth mirror 106.6 as an inertial reference (i.e. as a reference optical element unit) to which all further components 106.1 to 106.5, 103.1 and 104.1 participating in the imaging process are referred to. As can be seen from FIG. 1, the sixth mirror 106.6, in the light path, is the ultimate mirror unit hit last by the exposure light 105.1 when transferring the image of a pattern formed on the mask 103.1 onto the substrate 104.1.

To this end, the metrology arrangement uses a metrology unit 110.1 comprising a plurality of metrology devices 110.2, 110.3 and 110.4 mechanically connected to a projection system metrology support structure 112.1 which in turn is supported by the projection optics box structure 102.1 as well as a metrology device 110.5 mechanically connected to a substrate system metrology support structure 112.2 as it is indicated in FIG. 1 (highly schematically) and FIG. 2. In the present embodiment, each metrology device 110.2, 110.3, 110.4 and 110.5 comprises a sensor head connected to the projection system metrology support structure 112.1 or the substrate system metrology support structure 112.2, respectively, and cooperating with a reference element 110.6 mechanically connected directly to the respective mirror 106.1 to 106.6, the mask table support device 103.3, the substrate system metrology support structure 112.2 and the substrate table support device 104.3, respectively.

The term "mechanically connected directly", in the sense of the invention, is to be understood as a direct connection between two parts including (if any) a short distance between the parts allowing to reliably determine the position of the one part by measuring the position of the other part. In particular, the term may mean without the interposition of further parts introducing uncertainties in the position determination, e.g. due to thermal or vibration effects. It will be appreciated that, with certain embodiments of the invention, the reference element may not be a separate component connected to the mirror but many be directly or integrally formed on a surface of the mirror, e.g. as a grating or the like formed in a separate process upon manufacture of the mirror.

In the present embodiment, the metrology devices 110.2, 110.3, 110.4 and 110.5 operate according to an encoder principle, i.e. the sensor head emits a sensor light beam towards a structured surface and detects a reading light beam reflected from the structured surface of the reference element. The structured surface may be, for example, a grating comprising a series of parallel lines (one-dimensional grating) or a grid of mutually inclined lines (two-dimensional grating) etc. Positional alteration is basically captured from counting the lines passed by the sensor beam which may be derived from the signal achieved via the reading beam.

It will be appreciated however that, with other embodiments of the invention, apart from the encoder principle any other type of contactless measurement principle (such as e.g. an interferometric measurement principle, a capacitive measurement principle, an inductive measurement principle etc) may be used alone or in arbitrary combination. However, it will also be appreciated that, with other embodiments of the invention, any suitable contact based metrology arrangement may be used as well. As contact based working principles magnetostrictive or electrostrictive working principles etc may be used for example. In particular, the choice of the working principle may be made as a function of the accuracy requirements.

The metrology device 110.2 associated to the sixth mirror 106.6 (in all six degrees of freedom) captures the first spatial relationship between the projection system metrology support structure 112 and the sixth mirror 106.6 which forms the inertial reference. Furthermore, the metrology devices 110.2, 110.3, 110.4 and 110.5 associated to the other components 106.1 to 106.5, 103.1 and 104.1 participating in the imaging process (in all six degrees of freedom) capture the spatial relationship between the projection system metrology support structure 112.1 and the associated component 106.1 to 106.5, 103.1 and 104.1.

In the case of the substrate 104.1 this is done in a cascaded manner (see FIG. 2) using the metrology device 110.4 mechanically connected to the projection system metrology support structure 112.1 (in combination with a reference element 110.6 mechanically connected directly to the substrate system metrology support structure 112.2) and the substrate system metrology device 110.5 mechanically connected to the substrate system metrology support structure 112.2 (in combination with a reference element 110.6 mechanically connected directly to the substrate table support device 104.3).

Finally, the metrology arrangement 110 determines the spatial relationship between the sixth mirror 106.6 and the respective further component 106.1 to 106.5, 103.1 and 104.1 using the first spatial relationship and the second spatial relationship. Corresponding metrology signals are then provided to the control unit 109 which in turn generates, as a function of these metrology signals, corresponding control signals for the respective support device 108.1 to 108.6, 103.3 and 104.3.

It will be appreciated that, with other embodiments of the invention, direct measurement of the spatial relation between the reference optical element (e.g. the sixth mirror) and any one of the respective further component (e.g. mirrors 106.1 to 106.5, mask 103.1 and substrate 104.1) participating in the imaging process may also be provided. Depending on the spatial boundary conditions an arbitrary combination of such direct and indirect measurements may also be used.

In the embodiment shown, as a function of the metrology signals representative of the first spatial relationship between the metrology structure and the sixth mirror 106.6, the control unit 109 generates corresponding control signals for the first support device 108.6 of the sixth mirror 106.6 (i.e. the first optical element unit in the sense of the present invention) to adjust the sixth mirror 106.6 at the above first adjustment control bandwidth (ranging from 5 Hz to 100 Hz, preferably from 40 Hz to 100 Hz) with respect to the projection system metrology support structure 112.1 of the metrology unit 110.1.

This low bandwidth control of the critical first optical element unit 106.6 provides low bandwidth drift control of the first optical element unit 106.6 with respect to the metrology structure of the metrology unit 110.1. In other words, it allows the first optical element unit 106.6 to follow corresponding low-frequency motions of the metrology structure of the metrology unit 110.1 capturing the spatial relationship between the first optical element unit 106.6 and the projection system metrology support structure 112.1 of the metrology unit 110.1. By this approach excessive relative motion between the first optical element unit 106.6 and the projection system metrology support structure 112.1 of the metrology unit 110.1 going beyond the capturing range of the capturing devices of the metrology unit 110.1 or, in other words, sensor range problems may be avoided in a very beneficial way.

It will be appreciated that the spatial relationship between the substrate table 104.2 and the substrate 104.1 is known, e.g. due to a measurement operation immediately preceding the exposure process. The same applies to the spatial relationship between the mask table 103.2 and the mask 103.1. Hence, the respective reference element 110.6 connected to the mask table 103.2 and the substrate table 104.2, respectively, also allows capturing the spatial relationship between the reference mirror 106.6 and the mask 103.1 and the substrate 104.1, respectively.

As a consequence, despite the fact that, typically, all components participating in the exposure process now have to be actively controlled, the requirements for the control bandwidth of the most critical first optical element unit 106.6 are greatly relaxed in a highly beneficial way. This positive effect, generally, largely outweighs the increased expense for the active support of all components.

Hence, for example, compared to conventional systems where, typically, an adjustment control bandwidth of 200 Hz to 300 Hz is used and considered necessary for each individual optical element unit, with the present invention a considerably lower adjustment control bandwidth, e.g. between 5 Hz to 100 Hz, preferably between 40 Hz to 100 Hz, may be used for the critical first optical element unit 106.6, while all other components participating in the imaging process (i.e.

optical element units 106.1 to 106.5, mask unit 103.1 and substrate unit 104.1) may be readily controlled at the conventionally desired higher adjustment control bandwidth of, for example, 200 Hz to 400 Hz, to provide proper alignment with respect to the inertial reference formed by the first optical element unit 106.6.

It will be further appreciated that the above (indirect) measurement concept has the advantage that the instantaneous rigid-body position and orientation of the projection system metrology support structure of the metrology unit 110.1, in particular, vibration disturbances introduced into the metrology structure of the metrology unit 110.1, are essentially irrelevant as long as the projection system metrology support structure 112.1 is sufficiently rigid to largely avoid dynamic deformation of the metrology structure. In particular, less effort has to be made for stabilizing the position and/or orientation of the projection system metrology support structure in space. Typically, however, as in the present embodiment, the projection system metrology support structure itself may nevertheless be supported by the projection optics box structure 102.1 in a vibration isolated manner.

As mentioned above, to reduce the amount of vibration disturbance energy introduced into the projection optics box structure 102.1 (and, hence, into the projection system) and, ultimately, to reduce the adverse effects of such vibration disturbance energy, according to the present invention, a support concept is provided where the projection optics box structure 102.1 is supported on the base support structure 107 via a first vibration isolation device 113, while the substrate system metrology support structure 112.2 is supported on the base support structure 107 via a second vibration isolation device 114.

By this separate support of the projection optics box structure 102.1 and the substrate system metrology support structure 112.2 the optical elements 106.1 to 106.6 are mechanically decoupled from the support 112.2 of sources of secondary internal vibration disturbances such as cooling circuits (not shown in greater detail) of the substrate system metrology support structure 112.2 (generating secondary vibration disturbances and releasing secondary vibration disturbance energy, respectively, due to the turbulent flow on the cooling medium).

This mechanical decoupling is achieved by supporting both the projection optics box structure 102.1 and the substrate system metrology support structure 112.2 via the vibration isolation devices 113 and 114, respectively, such that there is no immediate structural connection between the projection optics box structure 102.1 and the substrate system metrology support structure 112.2. In other words, the projection optics box structure 102.1 and the substrate system metrology support structure 112.2 are supported in such a manner that a structural path of the structure borne vibration energy from the substrate system metrology support structure 112.2 to the projection optics box structure 102.1 only exists through the base support structure 107.

Hence, on the one hand, structure borne secondary vibration energy, in a beneficial way, is detoured via the base support structure 107, thereby beneficially increasing the length of the structural path the secondary vibration disturbance would have to travel to reach the optical projection system and, consequently, beneficially increasing attenuation of the secondary vibration disturbance.

On the other hand, the vibration isolation device 114 further reduces the structure borne secondary vibration disturbance energy introduced into the base support structure 107, while the vibration isolation device 113 even further reduces the amount of structure borne vibration disturbance energy stemming from the substrate system metrology support structure 112.2, which is further introduced into the projection optics box structure 102.1 from the base support structure 107.

It will be appreciated that, preferably, a similar approach is selected for the support of primary sources of vibration disturbance such as the substrate table support device 104.3 and the support of the mask table support device 103.3, which then is also supported on the base support structure 107 via a corresponding vibration isolation device (not shown in greater detail).

As can be seen from FIG. 2, a similar support strategy is also chosen for an internal cooling device 115 of the optical projection unit 102, which also forms an internal secondary vibration disturbance source in the sense of the present invention. The internal cooling device 115 is a sleeve surrounding the optical elements 106.1 to 106.6. The internal cooling device 115 is designed such that has no immediate physical or structural contact with the optical elements 106.1 to 106.6, their associated support devices 108.1 to 108.6 and the projection optics box structure 102.1. The internal cooling device 115 only has immediate physical or structural contact with the base structure 107 via an internal cooling device support structure 115.1. It will be appreciated that the internal cooling device support structure 115.1 may also be supported on the base support structure 107 via a further vibration isolation device (not shown in greater detail).

As can be seen from FIG. 2, to avoid such immediate physical or structural contact, the internal cooling device 115 has corresponding openings or recesses 115.2 through which the support devices 108.1 to 108.6, respectively, may reach without contacting the internal cooling device 115. Furthermore, the internal cooling device support structure 115.1 reaches through corresponding openings or recesses 102.2 provided within the projection optics box structure 102.1 without physically contacting the latter.

It will be appreciated that, one or more further cooling devices, in particular, external cooling devices surrounding the projection optics box structure 102.1, may be provided and supported on the base support structure 107 in a manner similar to the internal cooling device 115 (i.e. without immediate physical or structural contact with the optical elements 106.1 to 106.6, their associated support devices 108.1 to 108.6 and the projection optics box structure 102.1) as it is indicated in FIG. 2 by the dashed contour 116.

The first vibration isolation device 113 has a first vibration isolation resonant frequency of about 0.5 Hz, thereby achieving a beneficial low pass vibration isolation at this location. It will be appreciated that, with other preferred embodiments of the invention, the first vibration isolation resonant frequency may be selected to be located in a range from 0.05 Hz to 8.0 Hz, a range from 0.1 Hz to 1.0 Hz, or a range from 0.2 Hz to 0.6 Hz. In any of these cases beneficial low pass vibration isolation is achieved.

In the present example, the same applies to the second vibration isolation resonant frequency of the second vibration isolation device 114, which is also about 0.5 Hz. Here as well, the second vibration isolation resonant frequency may be selected to be located in a range from 0.05 Hz to 8.0 Hz, a range from 0.2 Hz to 1.0 Hz, or a range from 0.2 Hz to 0.6 Hz. In any of these cases beneficial low pass vibration isolation is achieved.

In order to further improve the vibration behavior of the projection optics box structure 102.1 each of the support devices 108.1 to 108.5 of the second subgroup of optical elements 106.7 comprises a vibration balancing mass unit 117.1 connected to the projection optics box structure 102.1 via a connecting device 117.2.

Preferably, each vibration balancing mass unit 117.1 and its connecting device 117.2 is associated to an actuator device (of the support device 108.1 to 108.5, respectively) actuating the optical element 106.1 to 106.5, respectively, and is configured to provide at least partial reaction force cancelling of the actuator force actuating the optical element 106.1 to 106.5, respectively. In other words, the vibration balancing mass unit 117.1 forms an actuator reaction force cancelling unit.

This vibration balancing system formed by the vibration balancing mass unit 117.1 and the connecting device 117.2, in a beneficial way, due to the vibration behavior of the vibration balancing system and the modification of the vibration behavior on the projection optics box structure 102.1, provides beneficial vibration balancing, leading to an overall reduction of the vibration amplitudes seen at the level of the optical elements 106.1 to 106.6.

The vibration balancing mass unit 117.1 and the connecting device 117.2, in the present embodiment, defines a balancing resonant frequency of about 25 Hz. It will be appreciated, however, that, with other embodiments of the invention, a balancing resonant frequency in a balancing resonant frequency range from 1 Hz to 40 Hz, a range from 5 Hz to 40 Hz, or a range from 15 Hz to 25 Hz, may be chosen as a function of the vibration behavior of the projection optics box structure.

In the present embodiment, no such vibration balancing mass unit is associated to the first optical element 106.6. However, with other embodiments of the invention, a configuration may also be chosen where such a vibration balancing mass unit is associated to the first optical element 106.6 and it is indicated by the dashed contour 117.3 in FIG. 2.

Furthermore, in the present embodiment, the respective vibration balancing mass unit 117.1 comprises a plurality of balancing mass elements held by the connecting device 117.2 such that it is arranged kinematically in series between the projection optics box structure 102.2 and the associated optical element 106.1 to 106.5.

The number of balancing mass elements is preferably chosen as a function of the vibration behavior of the support structure of the respective optical element. In the present example, six balancing mass elements distributed at the outer circumference of the respective optical element 106.1 to 106.5 are provided. It will be appreciated that, with other embodiments of the invention, any appropriate different number of balancing mass elements may be provided.

It will be appreciated, however, that, with other embodiments of the invention, one single balancing mass element per optical element may be sufficient. Furthermore, depending on the vibration behavior of the support structure of the optical elements, not all of the optical elements, in particular not all of the optical elements of the first subgroup 106.7 need to be provided with such vibration balancing mass units.

In the present example, to provide a beneficial influence on the vibration behavior of projection optics box structure 102.1, each connecting device 117.2 is configured to provide damping of vibration of the associated vibration balancing mass unit 117.1 at a first damping ratio of about 1%. It will be appreciated that, depending on the vibration behavior of the support structure of the optical elements, another first damping ratio may be selected. Preferably, the first damping ratio is selected from the following ranges, namely a range from 0.2% to 15%, a range from 0.2% to 5%, and a range from 1.0% to 3.0%.

As can be further seen from FIG. 2, the projection system metrology support structure 112.1 is supported on the projection optics box structure 102.1 (and, consequently, on the base support structure 107) via a third vibration isolation device 118. The third vibration isolation device 118 has a third vibration isolation resonant frequency of about 3 Hz.

It will be appreciated that, with other preferred embodiments of the invention, the third vibration isolation resonant frequency may also be selected to be located in a resonant frequency range from 1 Hz to 30 Hz, a range from 2 Hz to 10 Hz or a range from 3 Hz to 8 Hz. The appropriate third vibration isolation resonant frequency main particular be selected as a function of the vibration behavior of the projection system metrology support structure 112.1.

In the present example, the third vibration isolation resonant frequency and the balancing resonant frequency are tuned to each other insofar as they are separated by a frequency gap. Such an appropriately wide frequency gap is helpful in terms of avoiding interference effects and, ultimately, instability problems of the vibration system.

It will be appreciated that the width of the frequency gap is selected as a function of the vibration behavior of at least one of the projection optics box structure 102.1, the optical elements 106.1 to 106.6, the balancing mass units 117.1, the connecting devices 117.2 and the projection system metrology support structure 112.1. Preferably, the frequency gap is selected from a range from 1 Hz to 40 Hz, a range from 10 Hz to 25 Hz, or a range from 100% to 400% of the third vibration isolation resonant frequency.

Furthermore, in the present example, to provide a beneficial influence on the vibration behavior of the projection system metrology support structure 112.1, the third vibration isolation device 118 is configured to provide damping of vibration of the projection system metrology support structure 112.1 at a second damping ratio of about 20%.

It will be appreciated that, depending on the vibration behavior of the projection system metrology support structure 112.1, another second damping ratio may be selected. Preferably, the second damping ratio is selected from the following ranges, namely a range from 5% to 60%, a range from 10% to 30%, and a range from 20% to 25%.

It will be further appreciated that, by this two-stage vibration isolated support of the projection system metrology support structure 112.1 on the base structure 107 (via the vibration isolation devices 118 and 113), at least a two-stage, in many cases even a three stage vibration isolation from primary sources of vibration disturbance (such as the as the substrate table support device 104.3 and the support of the mask table support device 103.3) and from secondary sources of vibration disturbance (such as the substrate system metrology support structure 112.2 and the internal cooling device 115 of the optical projection unit 102) is achieved.

In other words, on the one hand, structure borne primary and secondary vibration disturbance energy, in a beneficial way, is detoured via the base support structure 107 and the projection optics box structure 102.1 before reaching (if at all) the projection system metrology support structure 112.1, thereby beneficially increasing the length of the structural path the primary and secondary vibration disturbance would have to travel to reach the projection system metrology support structure 112.1 and, consequently, beneficially increasing attenuation of the primary and secondary vibration disturbance. This ultimately leads to a particularly high vibration stabilization of the projection system metrology support structure 112.1 which is highly beneficial to the control performance of the system.

It will be appreciated that any desired and appropriate material may be selected for the respective support structure. For example, metals like aluminum may be used for the respective support structure, in particular, for support structures requiring a comparatively high rigidity at a comparatively low weight. It will be appreciated that the material for the support structures is preferably selected depending on the type or function of the support structure.

In particular, for the projection optics box structure 102.1 steel, aluminum (Al), titanium (Ti), so called Invar-alloys (i.e. iron nickel alloys with 33% to 36% of Ni, e.g. Fe64Ni36) and appropriate tungsten alloys (such as e.g. DENSIMET® and INERMET® composite materials, i.e. heavy metals with a tungsten content greater than 90% and a NiFe or NiCu binder phase) are preferably used.

Furthermore, for the projection system metrology support structure 112.1 materials such as silicon infiltrated silicon carbide (SiSiC), silicon carbide (SiC), silicon (Si), carbon fiber reinforced silicon carbide (C/CSiC), aluminum oxide ($Al_2O_3$), Zerodur® (a lithium aluminosilicate glass-ceramic), ULE® glass (a titania silicate glass), quartz, Cordierite (a magnesium iron aluminium cyclocilicate) or another ceramic material with low coefficient of thermal expansion and high modulus of elasticity may also be beneficially used.

In the present example, the projection optics box structure 102.1 is made from steel as a first material having a first rigidity. By this approach, compared to conventional support structure being made, for example, from aluminum, the weight increases by a factor of three, which would typically not be favored in conventional systems. However, due to the non-conventional support strategy followed according to the invention the increased weight of the projection optics box structure 102.1 is beneficial in terms of the vibration behavior.

Furthermore, the projection metrology support structure 112.1 is made from a second material having a second rigidity that is higher than the first rigidity of the steel material of the projection optics box structure 102.1. Such a high rigidity of the projection metrology support structure 112.1 is beneficial as it has been outlined above.

It will be appreciated that, with the microlithography apparatus 101 of the present embodiment, a line of sight accuracy may be obtained which is below 100 pm in all the relevant degrees of freedom, typically in the x direction and the y direction. As a general remark, it may be noted that a lower third resonant frequency of the third vibration isolation device 118 provides better line of sight accuracy.

With the optical imaging apparatus 101 of FIGS. 1 and 2 a method of transferring an image of a pattern onto a substrate may be executed using a preferred embodiment of a method of supporting components of an optical projection unit according to the invention as well as a method of capturing a spatial relationship between an optical element unit and a reference unit as it will be described in the following with reference to FIGS. 1 to 3.

In a transferring step of this method, an image of the pattern formed on the mask 103.1 is transferred onto the substrate 104.1 using the optical projection unit 102 of the optical imaging arrangement 101.

To this end, in a capturing step 119.3 of the transferring step, the spatial relationship between the components 106.1 to 106.6, 103.1 and 104.1 participating in the imaging process is captured using a method of capturing a spatial relationship between an optical element unit and a reference unit as it has been outlined above.

In a controlling step 119.4 of the transferring step, the position and/or orientation of the substrate table 104.2, the mask table 103.2 and the other mirrors 106.1 to 106.5 with respect to the sixth mirror 106.6 as well as the position and/or orientation of the sixth mirror 106.6 with respect to the metrology structure of the metrology unit 110.1 is controlled as a function of the spatial relationship previously captured in the capturing step 119.3 as it has been outlined above. In an exposure step, immediately following or eventually overlapping the controlling step 119.4, the image of the pattern formed on the mask 103.1 is then exposed onto the substrate 104.1 using the optical imaging arrangement 1.

In a partial step of the controlling step 119.4, the mask unit 103 with the mask 103.1 and the substrate unit 104 with the substrate 104.1 previously provided are adjusted in space. It will be appreciated that the mask 103.1 and the substrate 104.1 may also be inserted into the mask unit 103 and the substrate unit 104, respectively, at a later point in time prior to the actual position capturing or at an even later point in time prior to the exposure step.

According to a preferred embodiment of a method of supporting components of an optical projection unit according to the invention, in a step 119.1, the components of the optical projection unit 102 are first provided and then supported in a step 119.2 as it has been outlined above. To this end, in the step 119.2, the mirrors 106.1 to 106.6 of the optical projection unit 102 are supported and positioned within the projection optics box structure 102.1 of the optical projection unit 102. In step 119.4, the mirrors 106.1 to 106.6 are then actively supported at the respective control bandwidth in the projection optics box structure 102.1 to provide a configuration as it has been described above in the context of FIGS. 1 and 2.

In the capturing step 119.3 the metrology arrangement 110 (previously provided in a configuration as it has been described above in the context of FIGS. 1 and 2) is used. It will be appreciated that the reference elements may already have been provided at an earlier point in time together with the respective mirror 106.1 to 106.6 on which they are located. However, with other embodiments of the invention, the reference elements may be provided together with the other components of the metrology arrangement 110 at a later point in time prior to the actual position capturing.

In the capturing step 119.3, the actual spatial relationship between the sixth mirror 106.6 as a central inertial reference of the optical imaging arrangement 101 and the substrate table 104.2, the mask table 103.2 as well as the other mirrors 106.1 to 106.5 is then captured as it has been outlined above.

It will be appreciated that the actual spatial relationship between the sixth mirror 106.6 and the substrate table 104.2, the mask table 103.2 and the other mirrors 106.1 to 106.5 as well as the actual spatial relationship of the sixth mirror 106.6 with respect to the metrology structure of the metrology unit 110.1 may be captured continuously throughout the entire exposure process. In the controlling step 119.4, the most recent result of this continuous capturing process is then retrieved and used.

As described above, in the controlling step 119.4, the position of the substrate table 104.2, the mask table 103.2 and the mirrors 106.1 to 106.6 is then controlled as a function of this spatial relationship previously captured before, in the exposure step, the image of the pattern formed on the mask 103.1 is exposed onto the substrate 104.1.

Second Embodiment

Figure 4:
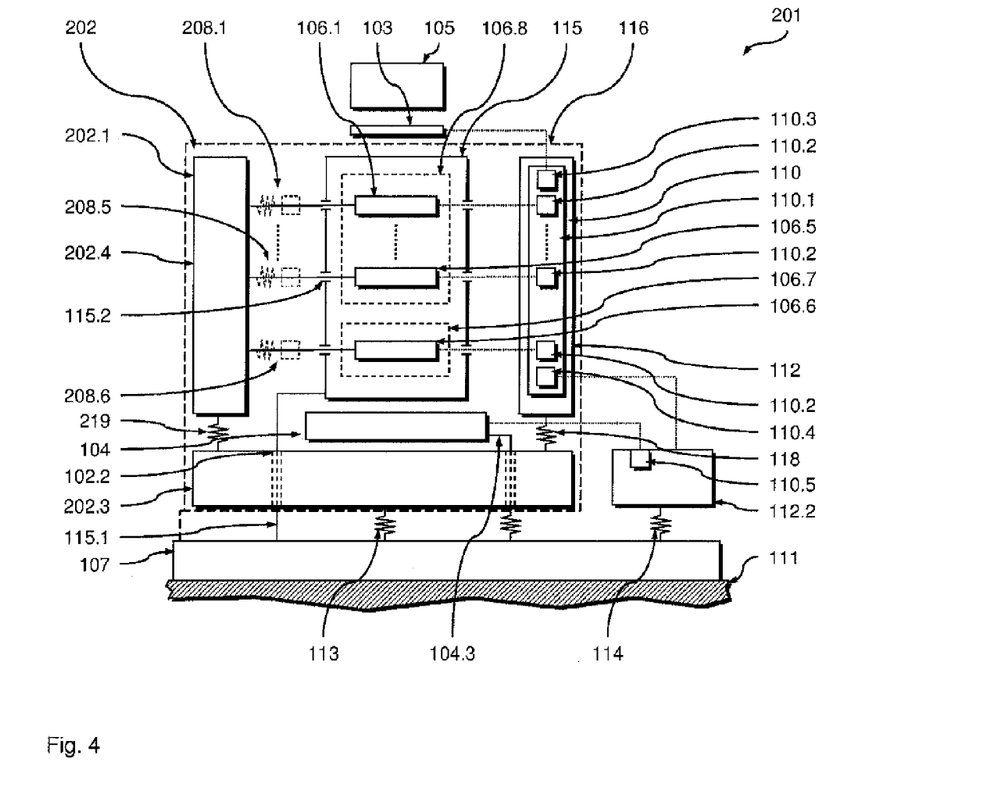
FIG. 4 is a schematic representation of a further preferred embodiment of an optical imaging arrangement according to the invention with which further preferred embodiments of methods according to the invention may be executed.

In the following, a second preferred embodiment of an optical imaging arrangement 201 according to the invention with which preferred embodiments of the methods according to the invention may be executed will be described with reference to FIG. 4. The optical imaging arrangement 201 in its basic design and functionality largely corresponds to the optical imaging arrangement 101 such that it is here mainly referred to the differences. In particular, identical components have been given the identical reference, while like components are given the same reference numeral increased by the value 100. Unless explicitly deviating statements are given in the following, explicit reference is made to be explanations given above in the context of the first embodiment with respect to these components.

The main difference between the optical imaging arrangement 201 and the optical imaging arrangement 101 lies within the deviating design of the projection optics box structure 202.1. It will be appreciated the projection optics box structure 202.1 may replace the projection optics box structure 102.1 in the optical imaging arrangement 101.

In the embodiment shown, the projection optics box structure 202.1 has a two-part design formed by a first projection optics box substructure 202.3 supporting a second projection optics box substructure 202.4, as well as the projection system metrology support structure 112.1. The second projection optics box substructure 202.4 is connected to the support devices 208.1 to 208.6 of the optical elements 106.1 to 106.6. Hence, the second projection optics box substructure 202.4 supports the optical elements 106.1 to 106.6.

The second projection optics box substructure 202.4 is supported on the first projection optics box substructure 202.3 via a fourth vibration isolation device 219 having a fourth vibration isolation resonant frequency in a vibration isolation resonant frequency range from 20 Hz to 30 Hz. It will be appreciated that, with other embodiments of the invention, the fourth vibration isolation resonant frequency may be selected from a range from 1 Hz to 30 Hz, a range from 1 Hz to 8 Hz, a range from 1 Hz to 40 Hz, or a range from 25 Hz to 30 Hz.

It will be further appreciated that, by this two-stage vibration isolated support of the second projection optics box substructure 202.4 on the base structure 107 (via the vibration isolation devices 219 and 113), at least a two-stage, in many cases even a three stage vibration isolation from primary sources of vibration disturbance (such as the as the substrate table support device 104.3 and the support of the mask table support device 103.3) and from secondary sources of vibration disturbance (such as the substrate system metrology support structure 112.2 and the internal cooling device 115 of the optical projection unit 102) is achieved.

In other words, structure borne primary and secondary vibration disturbance energy, in a beneficial way, is detoured via the base support structure 107 and the first projection optics box substructure 202.3 before reaching (if at all) the second projection optics box substructure 202.4, thereby beneficially increasing the length of the structural path the primary and secondary vibration disturbance would have to travel to reach the second projection optics box substructure 202.4 and, consequently, beneficially increasing attenuation of the primary and secondary vibration disturbance.

This ultimately leads to a particularly high vibration stabilization of the second projection optics box substructure 202.4 and, consequently, the optical elements 106.1 to 106.6 which is also highly beneficial to the control performance of the system.

As far as the other vibration isolation devices 113, 114 and 118 are concerned these are the same as with the first embodiment. Hence, the explanations given above in the context of the first embodiment here apply as well.

A further difference of the present example with respect to the first embodiment is the fact that the support devices 208.1 to 208.5 of the second subgroup of optical elements 106.7 are not provided with a vibration balancing mass unit. However, as indicated by the corresponding dashed contours in FIG. 4, any desired number of such vibration balancing mass units may be provided for any desired ones of the optical elements 106.1 to 106.6.

It will be appreciated that, with the microlithography apparatus 201 of the present embodiment, a line of sight accuracy may be obtained which is below 100 pm in all the relevant degrees of freedom, typically in the x direction and the y direction. As a general remark, it should be noted that here as well, a lower third resonant frequency of the third vibration isolation device 118 provides improved line of sight accuracy.

It will be appreciated that, here as well, any desired and appropriate material may be selected for the respective support structure. For example, metals like aluminum may be used for the respective support structure, in particular, for support structures requiring a comparatively high rigidity at a comparatively low weight. Further materials, such as the ones mentioned above in the context of the first embodiment may be selected, in particular, as a function of the type and/or function of the respective support structure. In the present example, both substructures of the projection optics box structure 202.1 are made from aluminum.

Third Embodiment

Figure 5:
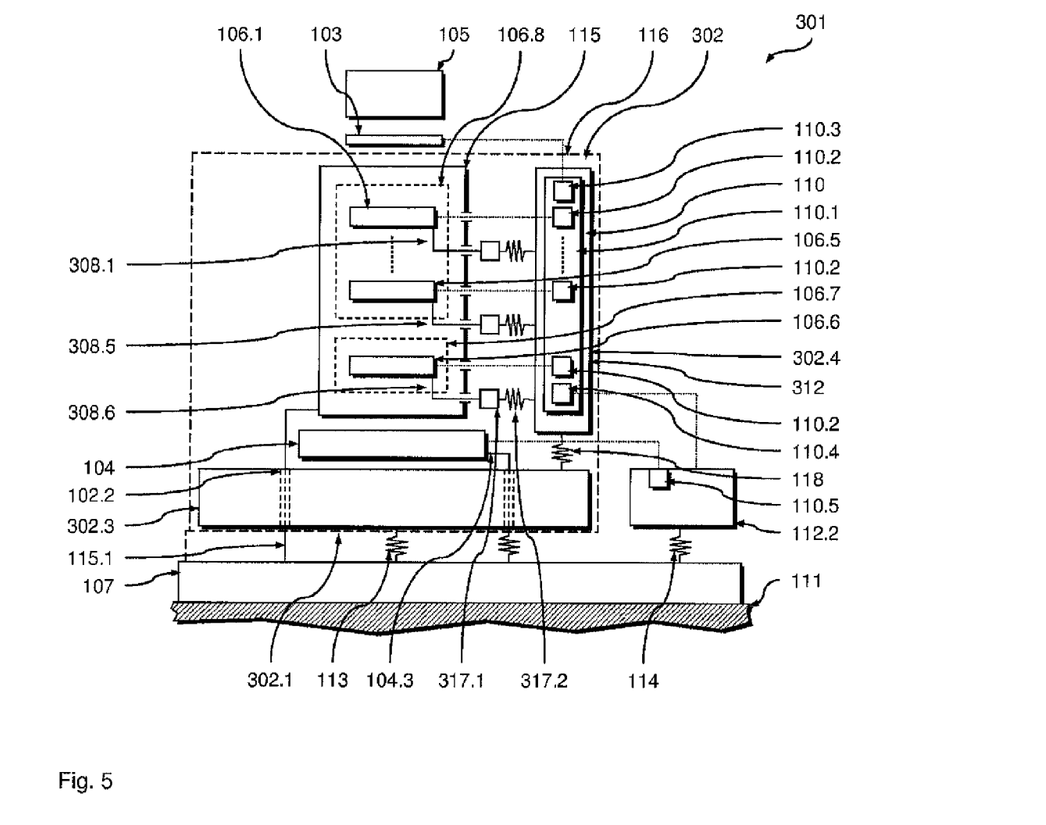
FIG. 5 is a schematic representation of a further preferred embodiment of an optical imaging arrangement according to the invention with which further preferred embodiments of methods according to the invention may be executed.

In the following, a third preferred embodiment of an optical imaging arrangement 301 according to the invention with which preferred embodiments of the methods according to the invention may be executed will be described with reference to FIG. 5. The optical imaging arrangement 301 in its basic design and functionality largely corresponds to the optical imaging arrangements 101 such that it is here mainly referred to the differences. In particular, identical components have been given the identical reference, while like components are given the same reference numeral increased by the value 200. Unless explicitly deviating statements are given in the following, explicit reference is made to be explanations given above in the context of the first embodiment with respect to these components.

The main difference between the optical imaging arrangement 301 and the optical imaging arrangement 301 again lies within the deviating design of the projection optics box structure 302.1. It will be appreciated the projection optics box structure 302.1 may replace the projection optics box structure 102.1 in the optical imaging arrangement 101.

In the embodiment shown, the projection optics box structure 302.1 has a two-part design formed by a first projection optics box substructure 302.3 supporting a second projection optics box substructure 302.4, which at the same time forms the projection system metrology support structure 312 such that a very compact design is achieved. The second projection optics box substructure 302.4 is connected to the support devices 308.1 to 308.6 of the optical elements 106.1 to 106.6. Hence, the second projection optics box substructure 302.4 supports the optical elements 106.1 to 106.6.

The second projection optics box substructure 302.4 is supported on the first projection optics box substructure 302.3 via a third vibration isolation device 318 having a third vibration isolation resonant frequency in a vibration isolation resonant frequency range from of about 3 Hz. It will be appreciated that, with other embodiments of the invention, the third vibration isolation resonant frequency may be selected from the ranges given above in the context of the first embodiment.

As far as the other vibration isolation devices 113 and 114 are concerned these are the same as with the first embodiment. Hence, the explanations given above in the context of the first embodiment he replies well.

A further difference of the present example with respect to the first embodiment is the fact that all support devices 308.1 to 308.6 are provided with a vibration balancing mass unit 317.1 connected to the projection optics box substructure 302.4 via a connecting device 317.2.

Each vibration balancing mass unit 317.1 and its associated connecting device 317.2, in the present embodiment, defines a balancing resonant frequency of about 15 Hz. It will be appreciated, however, that, with other embodiments of the invention, a balancing resonant frequency in a balancing resonant frequency range from 1 Hz to 40 Hz, a range from 5 Hz to 40 Hz, or a range from 15 Hz to 25 Hz, may be chosen as a function of the vibration behavior of the projection optics box structure 302.1.

In the present example, to provide a beneficial influence on the vibration behavior of projection optics box structure 302.1, each connecting device 317.2 is configured to provide damping of vibration of the associated vibration balancing mass unit 317.1 at a first damping ratio of about 1%. It will be appreciated that, depending on the vibration behavior of the support structure of the optical elements, another first damping ratio may be selected. Preferably, the first damping ratio is selected from the following ranges, namely a range from 0.2% to 15%, a range from 0.2% to 5%, and a range from 1.0% to 3.0%.

It will be appreciated that, with the microlithography apparatus 301 of the present embodiment, a line of sight accuracy may be obtained which is below 1 nm in all the relevant degrees of freedom, typically in the x direction and the y direction. As a general remark, it should be noted that here as well, a lower third resonant frequency of the third vibration isolation device 118 provides improved line of sight accuracy. Furthermore, it should be noted that increased line of sight accuracy is achieved with increased rigidity of the second projection optics box substructure 302.4.

It will be appreciated that, here as well, any desired and appropriate material may be selected for the respective support structure. For example, metals like aluminum may be used for the respective support structure, in particular, for support structures requiring a comparatively high rigidity at a comparatively low weight. Further materials, such as the ones mentioned above in the context of the first embodiment may be selected, in particular, as a function of the type and/or function of the respective support structure. In the present example, both substructures of the projection optics box structure 302.1 are made from aluminum.

Although, in the foregoing, embodiments of the invention have been described where the optical elements are exclusively reflective elements, it will be appreciated that, with other embodiments of the invention, reflective, refractive or diffractive elements or any combinations thereof may be used for the optical elements of the optical element units.

What is claimed is:

1. An arrangement comprising:
an optical projection system comprising a group of optical elements configured to transfer an image of a pattern of a first object supported by a first support structure onto a second object supported by a second support structure; and
a support structure system;
wherein:
during use of the arrangement, the first and second support structures provide a primary source of vibration;
the support structure system comprises a base support structure, an optical element support structure and a secondary vibration source support structure of a secondary vibration source which is different from the primary source of vibration;
the optical element support structure supports the optical elements;
the secondary vibration source support structure supports the secondary vibration source;
the secondary vibration source is a source of a secondary vibration disturbance comprising structure borne vibration energy;
the secondary vibration source is located internal to the optical imaging arrangement;
the base support structure supports the optical element support structure and the secondary vibration source support structure so that a structural path of the structure borne vibration energy from the secondary vibration source to the optical element support structure only exists through the base support unit; and
the arrangement is an optical imaging arrangement.

2. The arrangement according to claim 1, wherein:
the secondary vibration source comprises a member of a secondary vibration source selected from the group which consisting of a component of a metrology system, a cooling unit of the metrology system, a component of the optical projection system, a moving component of the optical projection system, and a cooling unit of the optical projection system; and
the secondary vibration source support structure is supported on the base support structure in a vibration isolated manner.

3. The arrangement according to claim 1, wherein:
the optical element support structure comprises an optical element support unit;
the optical element support unit supports the optical elements; and
the optical element support unit is supported on the base support structure via a vibration isolation device.

4. The arrangement according to claim 3, wherein the vibration isolation device has a vibration isolation resonant frequency which is from 0.05 Hz to 8.0 Hz.

5. The arrangement according to claim 3, wherein:
the optical element support unit is a third support unit,
the vibration isolation device is a first vibration isolation device having a first vibration isolation resonant frequency;
the optical element support structure comprises a fourth support unit;
the fourth support unit supports the optical elements; and
the fourth support unit is supported on the third support unit via a second vibration isolation device.

6. The arrangement according to claim 5, wherein the second vibration isolation device has a second vibration isolation resonant frequency of from 1 Hz to 30 Hz.

7. The arrangement according to claim 3, wherein:
the optical element support structure comprises a vibration balancing mass unit;
the vibration balancing mass unit is connected to the optical element support unit via a connecting device;
the connecting device having a balances resonant frequency of from 1 Hz to 40 Hz.

8. The arrangement according to claim 7, wherein the vibration balancing mass unit comprises a vibration balancing mass element arranged kinematically in series between the optical element support unit and an optical element of the group of optical elements.

9. The arrangement according to claim 7, wherein:
the group of optical elements comprises a first subgroup of optical elements and a second subgroup of optical elements;
the first subgroup of optical elements comprises a first optical element;
no balancing mass element of the at least one vibration balancing mass unit is associated with the first optical element;
the second subgroup of optical elements comprises a plurality of second optical elements; and
a balancing mass element of the vibration balancing mass unit is associated with each one of the second optical elements.

10. The arrangement according to claim 8, wherein:
a plurality of balancing mass elements is associated with at least one of the second optical elements; and
the plurality of balancing mass elements comprises at least one of at least two balancing mass elements and two to six balancing mass elements.

11. The arrangement according to claim 7, wherein the connecting device is configured to provide damping of vibration of the vibration balancing mass unit at a damping ratio of from 0.2% to 15%.

12. The arrangement according to claim 3, wherein:
the support structure system comprises a projection system metrology support structure which supports a metrology device associated with the group of optical elements and configured to capture a variable representative of a state of at least one optical element of the group of optical elements;
the projection system metrology support structure is supported on the base support structure via a further vibration isolation device; and
the projection system metrology support structure is supported on the base support structure via at least two vibration isolation devices arranged kinematically in series.

13. The arrangement according to claim 12, wherein the further vibration isolation device has a further vibration isolation resonant frequency of from 1 Hz to 30 Hz.

14. The arrangement according to claim 7, wherein the further vibration isolation resonant frequency and the balancing resonant frequency are separated by a frequency gap of from 1 Hz to 40 Hz.

15. The arrangement according to claim 12, wherein the further vibration isolation device is configured to provide damping of vibration of the at least one projection system metrology support structure at a damping ratio of from 5% to 60%.

16. The arrangement according to claim 3, wherein at least one member selected from the group consisting of the optical element support unit and a projection system metrology support structure comprises a material selected from the group consisting of steel, aluminum, titanium, an Invar-alloy, a tungsten alloy, a ceramic material, silicon infiltrated silicon carbide, silicon carbide, silicon, carbon fiber reinforced silicon carbide, aluminum oxide, a lithium aluminosilicate glass-ceramic, a titania silicate glass, quartz, and a magnesium iron aluminium cyclosilicate.

17. The arrangement according to claim 5, wherein the first support unit comprises a first material having a first rigidity, and the second support unit comprises a second material having a second rigidity which is greater than the first rigidity.

18. The arrangement according to claim 1, wherein at least one of the following holds:
the arrangement is configured to be used in microlithography using light at a wavelength in a UV range; and
the optical elements of the group of optical elements are reflective optical elements.

19. An arrangement, comprising:
an optical projection system comprising a group of optical elements configured to transfer an image of a pattern of a first object supported by a first support structure onto a second object supported by a second support structure; and
a support structure system,
wherein:
during use of the arrangement, the first and second support structures form a primary source of vibration;
the support structure system comprises a base support structure, an optical element support structure and a secondary vibration source support structure of a secondary vibration source different from the primary source of vibration;
the optical element support structure supports the optical elements;
the secondary vibration source support structure supports the secondary vibration source;
the secondary vibration source is a source of a secondary vibration disturbance comprising structure borne vibration energy and the vibration source being located internal to the optical imaging arrangement;
the base support structure supports the optical element support structure and the secondary vibration source support structure so that the secondary vibration source support structure is mechanically decoupled from the optical element support structure via at least one vibration isolation device; and
the arrangement is an optical imaging arrangement.

20. An arrangement, comprising:
an optical projection system comprising a group of optical elements configured to transfer an image of a pattern of a first object supported by a first support structure onto a second object supported by a second support structure; and
a support structure system,
wherein:
the support structure system comprises a base support structure, an optical element support structure and a projection system metrology support structure;
the optical element support structure supports the optical elements;
the optical element support structure is supported on the base support structure via a first vibration isolation device;
the projection system metrology support structure supports a metrology device associated with the group of optical elements;
the projection system metrology support is configured to capture a variable representative of a state of an optical element of the group of optical elements;
the projection system metrology support structure is supported on the optical element support structure via a second vibration isolation device; and
the arrangement is an optical imaging arrangement.

* * * * *

UNITED STATES PATENT AND TRADEMARK OFFICE
CERTIFICATE OF CORRECTION

| | | |
|---|---|---|
| PATENT NO. | : 9,030,647 B2 | Page 1 of 1 |
| APPLICATION NO. | : 14/138987 | |
| DATED | : May 12, 2015 | |
| INVENTOR(S) | : Kwan et al. | |

It is certified that error appears in the above-identified patent and that said Letters Patent is hereby corrected as shown below:

In the specification

Col. 16, lines 64-67, insert the paragraph -- This…system. --.

Col. 17, line 22, delete "cyclocilicate)" and insert -- cyclosilicate) --.

In the claims

Col. 23, line 15, Claim 10, delete "claim 8," and insert -- claim 9, --.

Signed and Sealed this
Tenth Day of November, 2015

Michelle K. Lee
*Director of the United States Patent and Trademark Office*